United States Patent [19]
Javidi

[11] Patent Number: 5,846,318
[45] Date of Patent: Dec. 8, 1998

[54] METHOD AND SYSTEM FOR CONTROLLING GROWTH OF A SILICON CRYSTAL

[75] Inventor: Massoud Javidi, Chesterfield, Mo.

[73] Assignee: MEMC Electric Materials, Inc., St. Peters, Mo.

[21] Appl. No.: 896,177

[22] Filed: Jul. 17, 1997

[51] Int. Cl.$^6$ .......................... C30B 15/00; C30B 15/26; C30B 15/20

[52] U.S. Cl. ................................ 117/14; 117/13; 117/15; 117/201; 117/202; 117/208; 117/16

[58] Field of Search ................................. 117/13, 14, 15, 117/16, 201, 202, 208, 932, 30

[56] References Cited

U.S. PATENT DOCUMENTS

| | | | |
|---|---|---|---|
| 3,740,563 | 6/1973 | Reichard | 250/222 R |
| 4,350,557 | 9/1982 | Scholl et al. | 156/601 |
| 4,710,258 | 12/1987 | Latka | 156/601 |
| 4,926,357 | 5/1990 | Katsuoka et al. | 364/560 |
| 5,138,179 | 8/1992 | Baba et al. | 250/560 |
| 5,170,061 | 12/1992 | Baba | 250/561 |
| 5,178,720 | 1/1993 | Frederick | 156/618.1 |
| 5,183,528 | 2/1993 | Baba et al. | 156/601 |
| 5,240,684 | 8/1993 | Baba et al. | 422/249 |
| 5,288,363 | 2/1994 | Araki | 156/601 |
| 5,378,900 | 1/1995 | Hirano et al. | 117/201 |
| 5,437,242 | 8/1995 | Hofstetter et al. | 117/14 |
| 5,588,993 | 12/1996 | Holder | 117/13 |
| 5,653,799 | 8/1997 | Fuerhoff | 117/14 |
| 5,665,159 | 9/1997 | Fuerhoff | 117/201 |

FOREIGN PATENT DOCUMENTS

| | | | |
|---|---|---|---|
| 0450502A1 | 10/1991 | European Pat. Off. | C30B 15/26 |
| 63-239181 | 10/1988 | Japan | C30B 15/26 |
| 63-256594 | 10/1988 | Japan | C30B 15/26 |
| 3-112885 | 5/1991 | Japan | C30B 15/26 |
| 4-300283A | 10/1992 | Japan | C30B 15/20 |

OTHER PUBLICATIONS

Gonzalez and Wintz, Digital Image Processing, 1987, pp. 36–52.

F. Shimura, Semiconductor Silicon Crystal Technology, pp. 116–121, Academic Press (San Diego, CA 1989).

Kristine Gould, AI Applications in Crystal Growth, Jul. 1990.

*Primary Examiner*—Robert Kunemund
*Assistant Examiner*—Evelyn A. Defilló
*Attorney, Agent, or Firm*—Senniger, Powers, Leavitt & Roedel

[57] ABSTRACT

Method and system for use with a Czochralski crystal growing apparatus. The crystal growing apparatus has a heated crucible for melting solid silicon to form a melt from which the single crystal is pulled. The melt has an upper surface above which unmelted silicon is exposed until melted. A camera generates images of a portion of the interior of the crucible. Each image includes a plurality of pixels and each pixel has a value representative of an optical characteristic of the image. An image processor processes the images as a function of the pixel values to detect edges in the images and groups the detected edges as a function of their locations in the images to define objects in the images. The defined objects each include one or more pixels and at least one of the defined objects is representative of a portion of solid silicon which is visible on the melt surface. A control circuit determines a parameter representative of a condition of the crystal growing apparatus based on the defined objects and controls the crystal growing apparatus in response to the determined parameter.

22 Claims, 9 Drawing Sheets

METHOD AND SYSTEM FOR CONTROLLING GROWTH OF A SILICON CRYSTAL

BACKGROUND OF THE INVENTION

This invention relates generally to an improved method and system for controlling an apparatus or method employing the Czochralski process for growing silicon crystals and, particularly, to a vision system and method for measuring parameters of the silicon crystals and the silicon crystal growth process for use in automatically controlling the growth process based on the measured parameters.

The substantial majority of monocrystalline, or single crystal, silicon used to make silicon wafers for the microelectronics industry is produced by crystal pulling machines employing the Czochralski process. Briefly described, the Czochralski process involves melting chunks or granules of high-purity polycrystalline silicon, or polysilicon, in a quartz crucible located in a specifically designed furnace to form a silicon melt. Typically, the polysilicon is irregularly shaped chunk polysilicon prepared by the Siemens process, for example. Alternatively, free-flowing, generally spherically-shaped granular polycrystalline silicon, typically prepared by a relatively simpler and more efficient fluidized-bed reaction process may be used. The preparation and characteristics of chunk and granular polysilicon are further detailed in F. Shimura, *Semiconductor Silicon Crystal Technology*, pages 116–121, Academic Press (San Diego Calif., 1989) and the references cited therein.

Particularly with a charge of chunk polysilicon, the charge can shift during melting or its lower portion can melt away and leave a "hanger" of unmelted material stuck to the crucible wall above the melt. When the charge shifts or a hanger collapses, it may splatter molten silicon and/or cause mechanical stress damage to the crucible. However, by properly controlling the crucible temperature during melting, the effect of hangers and the like can be reduced.

According to the Czochralski process, a relatively small seed crystal is mounted above the crucible on the lower end of a pull cable or shaft hanging from a crystal lifting mechanism for raising and lowering the seed crystal. After melt completion, the crystal lifting mechanism lowers the seed crystal into contact with the molten silicon in the crucible. When the seed begins to melt, the mechanism slowly withdraws it from the silicon melt in a manner sufficient to achieve a desired crystal diameter and then to grow the single crystal at that diameter. As the seed is withdrawn, it draws silicon from the melt. During the growth process, the crucible rotates in one direction and the crystal lifting mechanism, cable, seed, and crystal rotate in an opposite direction.

When crystal growth is initiated, the thermal shock of contacting the seed with the melt may cause dislocations in the crystal. The dislocations are propagated throughout the growing crystal and multiplied unless they are eliminated in the neck region between the seed crystal and the main body of the crystal. The known methods of eliminating dislocations within silicon single crystal involve growing a neck having a small diameter at a relatively high crystal pull rate to completely eliminate dislocations before growing the body of the crystal. After dislocations are eliminated in the neck, its diameter is enlarged until the desired diameter of the main crystal body is reached.

The Czochralski process is controlled, at least in part, as a function of the diameter of the body of the crystal being grown. Commonly assigned application Ser. Nos. 08/459, 765 and 08/620,137 describe a method and system, respectively, for accurately and reliably measuring crystal diameter, detecting zero dislocation growth and determining the level of the silicon melt.

Several factors, including crystal diameter and melt level, affect or are indicative of the size and quality of the crystal during the crystal growing process. For example, the amount of heat provided to the crucible, the temperature of the molten silicon, the presence of unmelted or re-solidified polysilicon in the melt or attached to the crucible wall, the diameter of the crucible, the presence of quartz in the melt and the size and shape of the meniscus at the crystal-melt interface all affect the process or provide information regarding the crystal. Therefore, an accurate and reliable system for determining a number of parameters related to these factors is desired for controlling the crystal growing process.

SUMMARY OF THE INVENTION

Among the objects and features of the present invention may be noted the provision of an improved method and system of control and operation which overcome the disadvantageous conditions described above; the provision of such method and system for use with a crystal growing apparatus operating in accordance with the Czochralski process; the provision of such method and system which measure the rate at which a charge of polysilicon is melting in a crucible to form a silicon melt; the provision of such method and system which determine melt completion; the provision of such method and system which measure the temperature of the melt; the provision of such method and system which detect solid polysilicon in the crucible; the provision of such method and system which detect contact between a seed crystal and the melt; and the provision of such method which can be carried out efficiently and economically and such system which is economically feasible and commercially practical.

Briefly described, a closed loop control method embodying aspects of the present invention is for use in combination with an apparatus for growing a silicon single crystal. The crystal growing apparatus has a heated crucible for melting solid silicon to form a melt from which the single crystal is pulled. The melt has an upper surface above which unmelted silicon is exposed until melted. The method includes the step of generating images of a portion of the interior of the crucible. The images each include a plurality of pixels and the pixels each have a value representative of an optical characteristic of the image. The method also includes processing the images as a function of the pixel values to detect edges in the images and grouping the detected edges as a function of their locations in the images to define objects in the images. The defined objects each include one or more pixels and at least one of the defined objects is representative of a portion of solid silicon which is visible on the melt surface. The method further includes the steps of determining at least one parameter representative of a condition of the crystal growing apparatus based on the defined objects and controlling the crystal growing apparatus in response to the determined parameter.

Generally, another form of the invention is a system for use in combination with an apparatus for growing a silicon single crystal. The crystal growing apparatus has a heated crucible for melting solid silicon to form a melt from which the single crystal is pulled. The melt has an upper surface above which unmelted silicon is exposed until melted. The system includes a camera for generating images of a portion of the interior of the crucible. The images each include a plurality of pixels and the pixels each have a value representative of an optical characteristic of the image. The system also includes an image processor for processing the images as a function of the pixel values to detect edges in the images. The image processor groups the detected edges as a function of their locations in the images to define objects in the images. The defined objects each include one or more pixels and at least one of the defined objects is representative of a portion of solid silicon which is visible on the melt surface. The system further includes a control circuit for determining at least one parameter representative of a condition of the crystal growing apparatus based on the defined objects and for controlling the crystal growing apparatus in response to the determined parameter.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
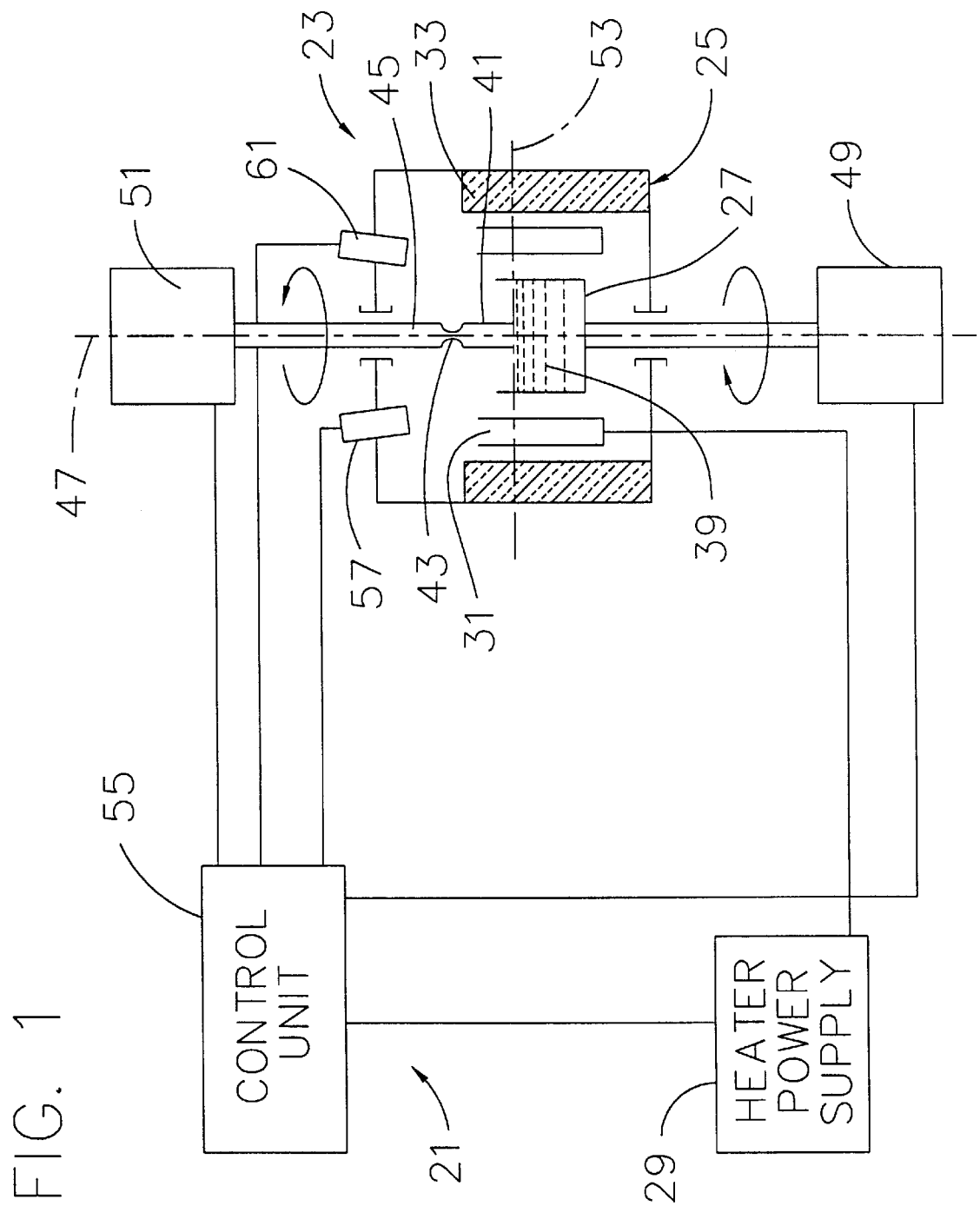
FIG. 1 is an illustration of a crystal growing apparatus and a system for controlling the crystal growing apparatus according to a preferred embodiment of the invention.

Referring now to FIG. 1, a system 21 is illustrated for use with a Czochralski crystal growing apparatus 23 in accordance with the present invention. In the illustrated embodiment, the crystal growing apparatus 23 includes a vacuum chamber 25 enclosing a crucible 27. A heater power supply 29 energizes a resistance heater or other heating means 31 surrounding the crucible 27. Insulation 33 preferably lines the inner wall of the vacuum chamber 25. Typically, a chamber cooling jacket (not shown) fed with water surrounds vacuum chamber 25 and an inert atmosphere of argon gas 35 (see FIGS. 3 and 4) is fed into vacuum chamber 25 as gas is removed from within vacuum chamber 25 by a vacuum pump (not shown).

Figure 3:
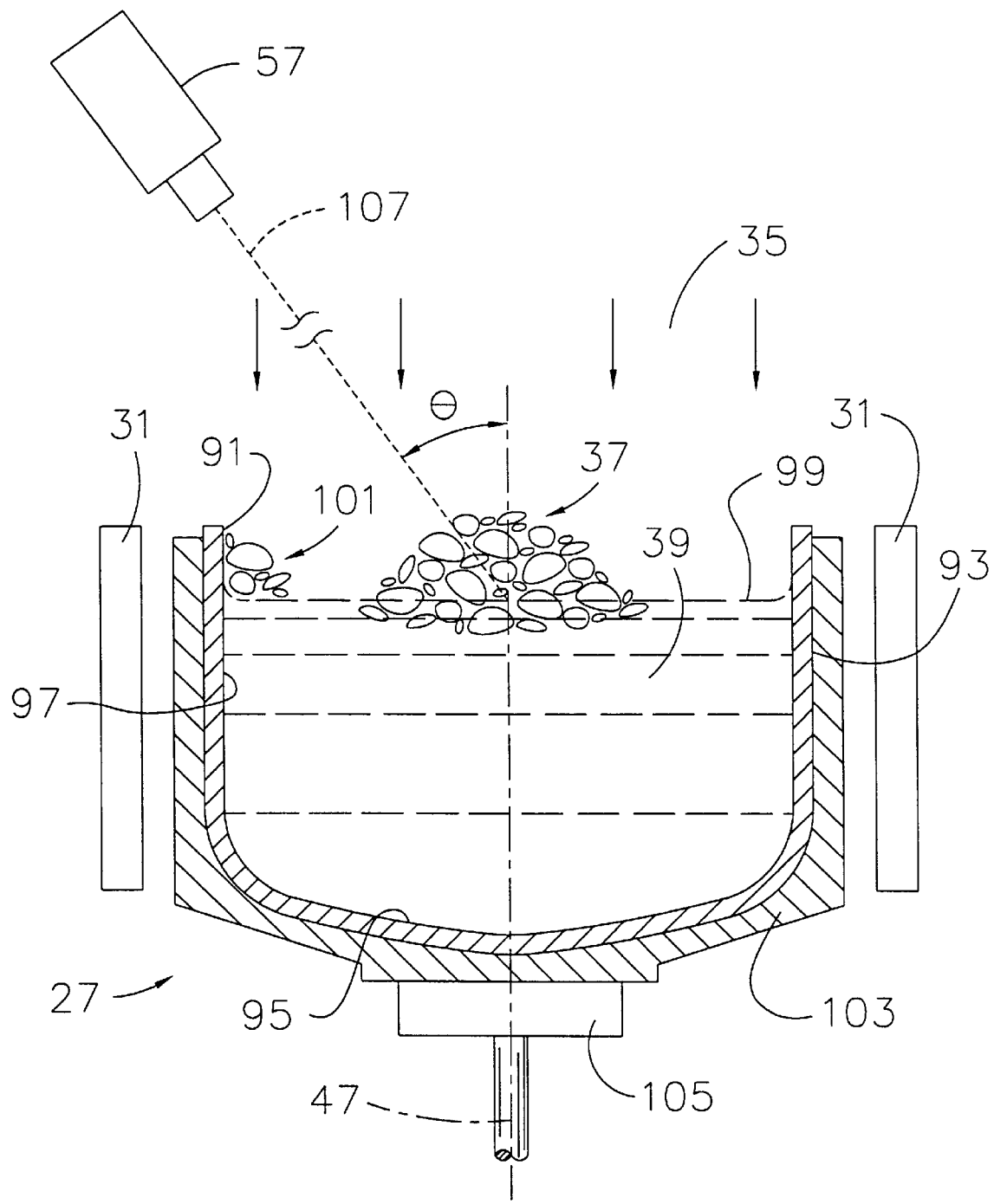
FIG. 3 is a sectional view of the crystal growing apparatus of FIG. 1 showing a partially melted initial charge of chunk polysilicon.

According to the Czochralski single crystal growth process, a quantity of polycrystalline silicon, or polysilicon, portions of which are generally indicated 37 in FIG. 3, is charged to crucible 27. The heater power supply 29 provides electric current through the resistance heater 31 to melt the charge and, thus, form a silicon melt 39 from which a single crystal 41 is pulled. The single crystal 41 starts with a seed crystal 43 attached to a pull shaft or cable 45. As shown in FIG. 1, the single crystal 41 and crucible 27 have a common axis of symmetry 47.

A crucible drive unit 49 rotates crucible 27 in, for example, the clockwise direction and raises and lowers crucible 27 as desired during the growth process. A crystal drive unit 51 rotates the cable 45 in an opposite direction from that which the crucible drive unit 49 rotates crucible 27. The crystal drive unit 51 also raises and lowers crystal 41 relative to a melt level 53 as desired during the growth process. Crystal drive unit 51 first lowers the seed crystal 43 via cable 45 nearly into contact with the molten silicon of melt 39 for preheating and then into contact with melt 39 at the melt level 53. As seed crystal 43 melts, crystal drive unit 51 slowly withdraws, or pulls, it from the melt 39 contained by crucible 27, seed crystal 43 drawing silicon from melt 39 to produce a growth of silicon single crystal 41.

In one embodiment, crystal drive unit 51 rotates crystal 41 at a reference rate as it pulls crystal 41 from melt 39. Crucible drive unit 49 similarly rotates crucible 27 at a second reference rate, but usually in the opposite direction relative to crystal 41. A control unit 55 initially controls the withdrawal, or pull, rate as well as the power supplied to heater 31 by power supply 29 to cause a neck down of crystal 41. Accurate and reliable control is desired during the crystal growth process, particularly in the neck portion of crystal 41. The neck is preferably grown at a substantially constant diameter as seed crystal 43 is drawn from melt 39. For example, the control unit 55 maintains a substantially constant neck diameter of about fifteen percent of the desired body diameter. After the neck reaches a desired length, control unit 55 then adjusts the rotation, pull and/or heating parameters to cause the diameter of crystal 41 to increase in a cone-shaped manner until a desired crystal body diameter is reached. Once the desired crystal diameter is reached, control unit 55 controls the growth parameters to maintain a relatively constant diameter as measured by the system 21 until the process approaches its end. At that point, the pull rate and heating are increased for decreasing the diameter to form a tapered portion at the end of single crystal 41. Commonly assigned U.S. Pat. No. 5,178,720, the entire disclosure of which is incorporated herein by reference, discloses one preferred method for controlling crystal and crucible rotation rates as a function of the crystal diameter.

Preferably, control unit 55 operates in combination with at least one two-dimensional camera 57 to determine a plurality of parameters of the growth process. For example, the camera 57 is a monochrome charge coupled device (CCD) camera, such as a Sony XC-75 CCD video camera having a resolution of 768×494 pixels. Another suitable camera is a Javelin SmartCam JE camera. Camera 57 is mounted above a viewport (not shown) of chamber 25 and aimed generally at the intersection of the axis 47 and melt 39 at melt level 53 (see FIGS. 3 and 4). For example, the operator of crystal growing apparatus 23 positions camera 57 at an angle of approximately 340 with respect to the substantially vertical axis 47.

According to the invention, camera 57 generates video images of the interior of crucible 27 before and during pulling of crystal 41. During pulling, the images generated by camera 57 preferably include a portion of a meniscus 59 (see FIG. 4) at the interface between melt 39 and crystal 41. In one preferred embodiment, camera 57 is equipped with a lens (e.g., 16 mm) providing a relatively wide field of view (e.g., approximately 320 mm). The lens may be a telephoto lens providing improved viewing of the interface between melt 39 and crystal 41. In an alternative embodiment, system 21 includes two cameras 57, one providing a relatively wide field of view for viewing the interior of crucible 27 generally and another one providing a relatively narrow field of view for viewing the melt-crystal interface particularly. In either instance, melt 39 and crystal 41 are essentially self-illuminating and an external light source for camera(s) 57 is not needed. For clarity, the following description is directed to a single camera 57.

Control unit 55 processes signals from camera 57 as well as from other sensors. For example, a temperature sensor 61, such as a photo cell, may be used to measure the melt surface temperature. Control unit 55 includes a programmed digital or analog computer 63 (see FIG. 2) for use in controlling, among other things, crucible drive unit 49, single crystal drive unit 51 and heater power supply 29 as a function of the processed signals.

Figure 2:
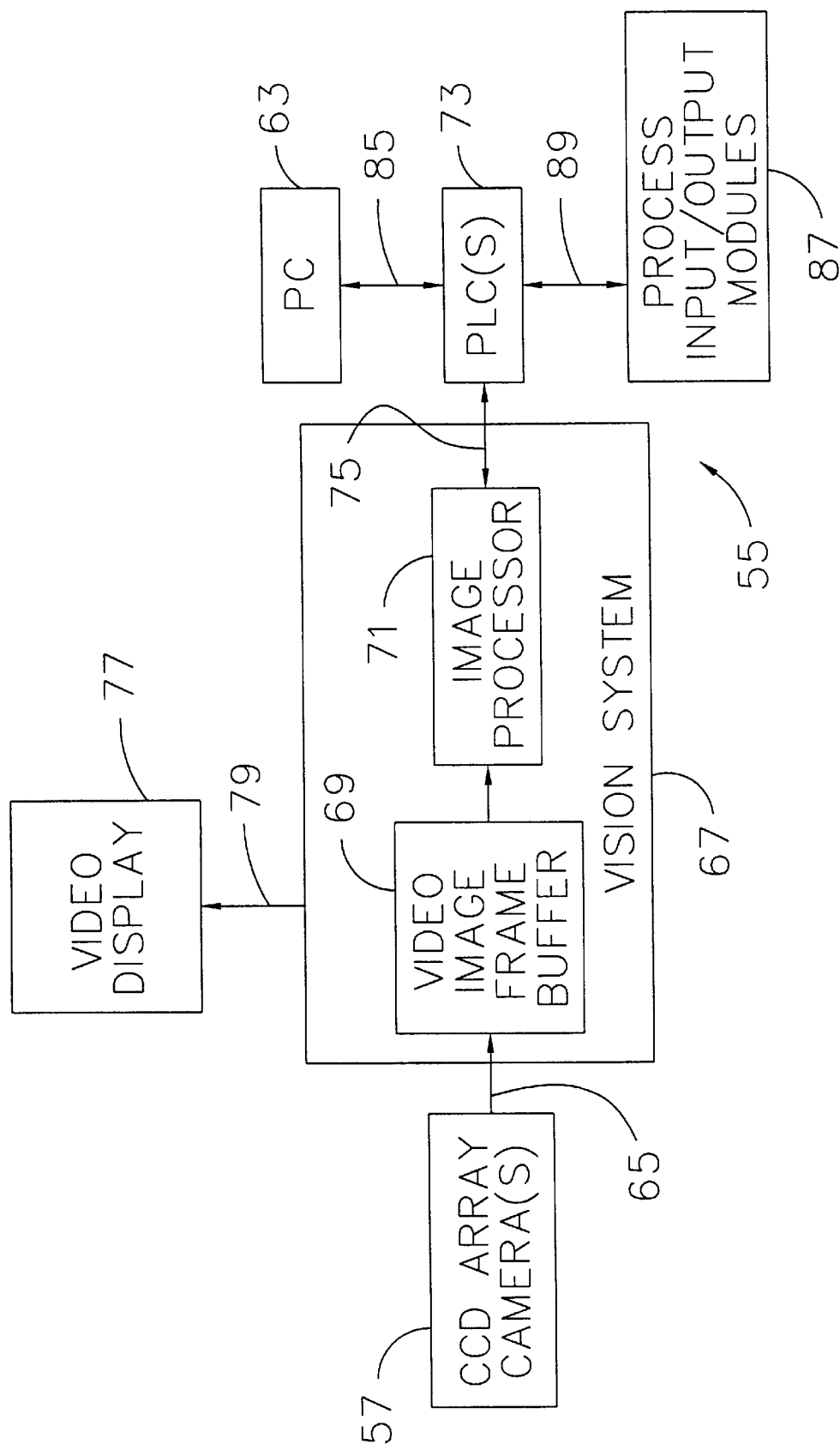
FIG. 2 is a block diagram of a control unit of the system of FIG. 1.

FIG. 2 illustrates a preferred embodiment of control unit 55 in block diagram form. Camera 57 communicates the video image of the interior of crucible 27 via line 65 (e.g., RS-170 video cable) to a vision system 67. As shown in FIG. 2, the vision system 67 includes a video image frame buffer 69 and an image processor 71 for capturing and processing the video image. As an example, vision system 67 is a CX-100 Imagination Frame Grabber or a Cognex CVS-4400 vision system. In turn, vision system 67 communicates with a programmable logic controller (PLC) 73 via line 75. In one preferred embodiment, the PLC 73 is a Model 575 PLC or a Model 545 PLC manufactured by Texas Instruments and line 75 represents a communications interface (e.g., VME backplane interface). Vision system 67 also communicates with a video display 77 via line 79 (e.g., RS-170 RGB video cable) for displaying the video image generated by camera 57. It is to be understood that vision system 67 as embodied by certain systems may include its own computer (not shown) or may be used in combination with the personal computer 63 for processing the captured images.

In the illustrated embodiment of FIG. 2, PLC 73 communicates with computer 63 via line 85 (e.g., RS-232 cable) and with one or more process input/output modules 87 via line 89 (e.g., RS-485 cable). According to the invention, computer 63 is used to program the crystal growth process automation and provides an operator interface which permits the operator of crystal growing apparatus 23 to input a set of desired parameters for the particular crystal being grown. The process input/output module 87 provides a path to and from crystal growing apparatus 23 for controlling the growth process. As an example, PLC 73 receives information regarding the melt temperature from temperature sensor 61 and outputs a control signal to heater power supply 29 via process input/output module 87 for controlling the melt temperature thereby controlling the growth process. Depending on the particular controller that embodies PLC 73, the communications interface 75 may be, for example, a custom VME rack that includes an additional communications board (e.g., Model 2571 Program Port Expander Module using the RS-422 serial bidirectional PLC port).

Referring now to FIG. 3, crucible 27 has an inner surface 91, an outer surface 93 and a centerline generally along axis 47. The inner surface 91 of crucible 27 may be coated with a devitrification promoter and includes a bottom portion 95 and a side, or wall, portion 97. As shown in FIG. 3, the wall 97 of crucible 27 is substantially parallel to axis 47 which intersects an approximate geometric centerpoint of the bottom 95. While the geometry of the illustrated crucible 27 is preferred, the particular geometry of crucible 27 may vary from the illustrated embodiment and still fall within the scope of the invention.

In a preferred embodiment, the charge of chunk and/or granular polysilicon 37 is loaded into crucible 27 to prepare silicon melt 39. Commonly assigned U.S. Pat. No. 5,588,993, as well as application Ser. No. 08/595,075, filed Feb. 1, 1996, the entire disclosures of which are incorporated herein by reference, describe suitable methods of preparing the polycrystalline silicon charge. Once loaded, crucible 27 is placed in crystal growing apparatus 23, the heater 31 of which melts polysilicon 37 to form silicon melt 39. As shown in FIG. 3, polysilicon charge 37 is partially melted to form melt 39 and unmelted solid portions of polysilicon 37 float on an upper surface 99 of melt 39 because they have a lower density than the molten silicon. As described above, the charge of polysilicon 37 can shift during melting or have its lower portion melt away, leaving a hanger of unmelted material, generally indicated 101, stuck to crucible wall 97 above melt surface 99.

Referring further to FIG. 3, a susceptor 103 situated on a movable pedestal 105 associated with crucible drive unit 49 supports crucible 27. The pedestal 105 is positioned such that the bottom 95 of crucible 27 is near the top of heater 31 and gradually lowered into the space inside heater 31. The speed at which crucible drive unit 49 lowers crucible 27 into heater 31, as well as other factors (e.g., heater power, crucible rotation and system pressure), affects the melting of polysilicon 37. In the Czochralski method, the purge gas 35 flushes undesirable gases, such as SiO(g), out of crucible 27 during heating of polysilicon 37. Typically, purge gas 35 is an inert gas such as argon.

As described above, camera 57 is mounted in a viewport of chamber 25 and aimed generally at the intersection between axis 47 and the surface 99 of melt 39. As such, an optical axis 107 of camera 57 is at an acute angle $\theta$ (e.g., $\theta \approx 15°$–$34°$) with respect to axis 47. According to the invention, camera 57 preferably provides a field of view that includes the width of crucible 27. Further, proper lens and camera selection provides both telephoto viewing for high resolution of small seeds and necks as well as wide angle viewing of polysilicon charge 37 and the larger body portion of crystal 41.

Figure 4:
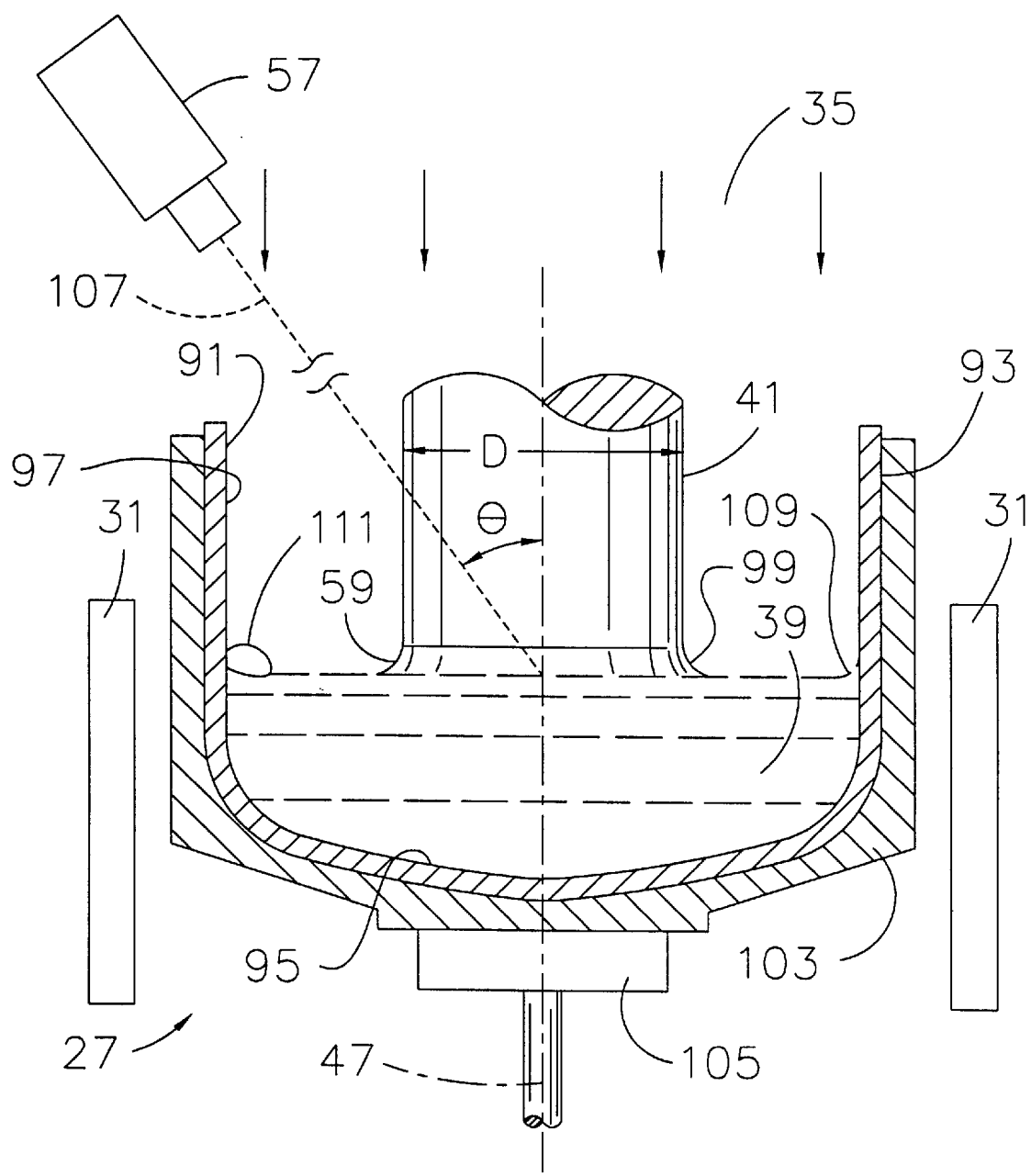
FIG. 4 is a sectional view of the crystal growing apparatus of FIG. 1 showing a fragmentary view of a silicon crystal being pulled from a melt contained therein.

FIG. 4, a fragmentary view of silicon crystal 41 being pulled from melt 39, illustrates a later phase of the crystal growth process following melt-down and dipping of seed crystal 43. As shown, crystal 41 constitutes a generally cylindrical body of crystalline silicon (i.e., an ingot) having a diameter D. It should be understood that an as-grown crystal, such as crystal 41, may not have a uniform diameter, although it is generally cylindrical. For this reason, diameter D may vary slightly at different axial positions along axis 47. Further, diameter D will vary in the different phases of crystal growth (e.g., seed, neck, crown, shoulder, body and end cone).

FIG. 4 also illustrates the surface 99 of melt 39 having the liquid meniscus 59 formed at the interface between crystal 41 and melt 39. As is known in the art, the reflection of crucible 27, particularly wall 97, on meniscus 59 is often visible as a bright ring adjacent crystal 41. Likewise, melt surface 99 has a liquid meniscus 109 formed at the melt-crucible interface which appears as a bright ring adjacent crucible wall 97. In a preferred embodiment, camera 57 provides a field of view including the width of crystal 41 and at least a portion of the bright ring of meniscus 59. Camera 57 (or another camera) also provides a field of view including the width of crucible 27 and at least a portion of the bright ring of meniscus 109. In addition, the wide field of view permits the detection of frozen or crystallized portions of melt 39, referred to as ice and generally indicated 111. Typically, such crystallization occurs at the interface between crucible wall 97 and melt 39 and grows on the melt surface 99 and towards crystal 41.

Figure 5:
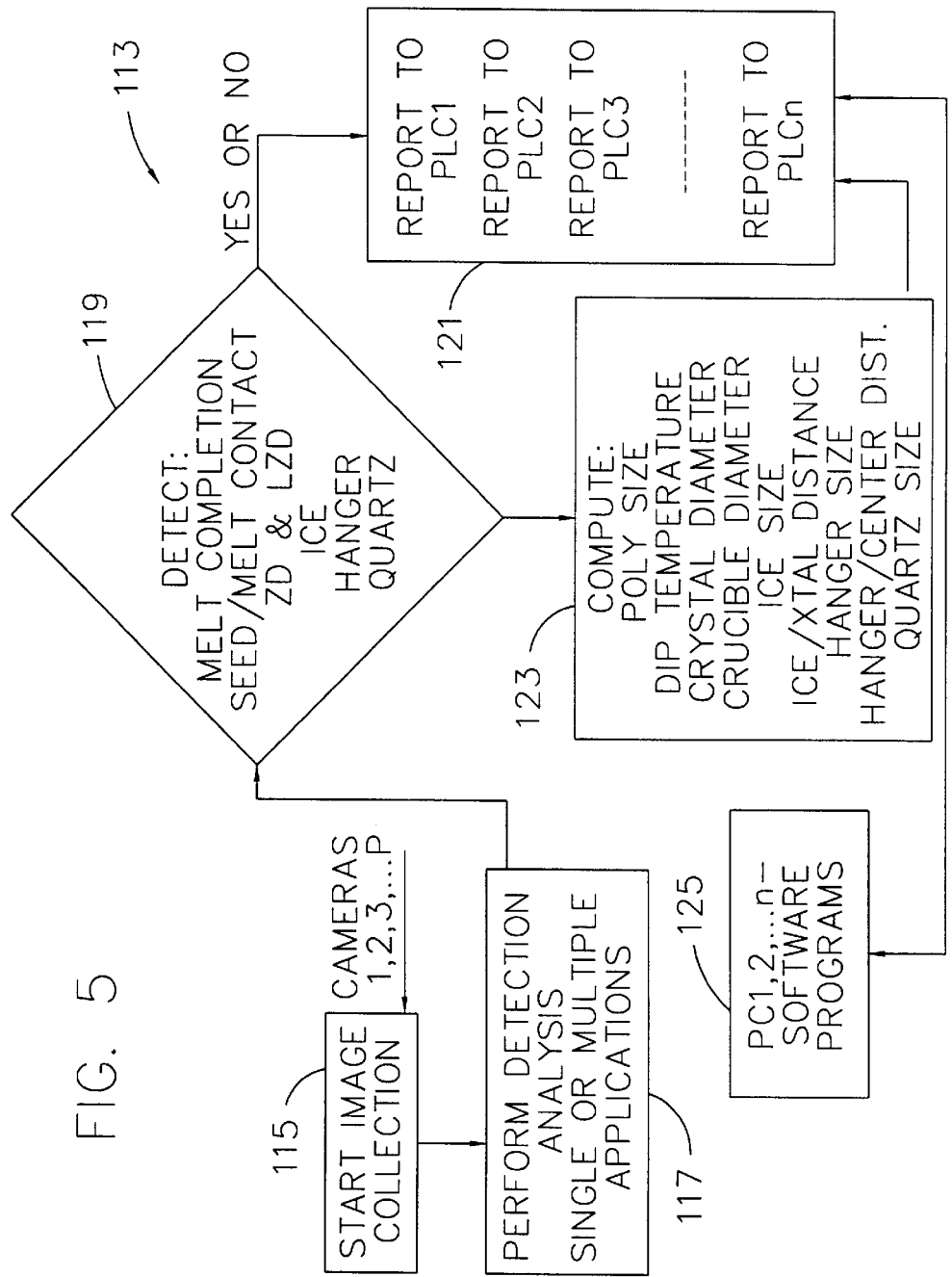
FIGS. 5–9 are exemplary flow diagrams illustrating operation of the control unit of FIG. 2.

Referring now to FIG. 5, system 21, including control unit 55, operates according to a flow diagram 113 for providing closed loop control of crystal growing apparatus 23. Beginning at step 115, camera 57 generates images of at least a portion of the interior of crucible 27. The frame buffer 69 of vision system 67 captures the images from the video image signal of camera 57 for processing by the image processor 71. As indicated by FIG. 5, it is contemplated that multiple cameras 57 may be used. For example vision system 67 may receive input from more than one crystal growing apparatus 23, each having at least one camera 57 mounted in its viewport. According to the invention, vision system 67 processes the images for each growth apparatus 23 individually.

The captured images of the interior of crucible 27 each comprise a plurality of pixels, each pixel having a value representative of a detected optical characteristic of the image. In this instance, the pixel values, or gray levels, correspond to the intensity of the pixels. In the vision system arts, edges are defined as regions in the image where there is a relatively large change in gray level over a relatively small spatial region. At step 117, image processor 71, operating in conjunction with PLC 73, processes the images as a function of the pixel values to detect edges in the images. Preferably, processor 71 performs several routines for analyzing the image, including edge detection routines that analyze the gray level changes (as a function of image intensity) in a defined region of the image. Various edge detection operators, or algorithms, for finding and counting edges in an image are known to those skilled in the art. For example, suitable edge detection routines include Canny or Hough algorithms. It is to be understood that in addition to intensity, other characteristics of the image, such as intensity gradient, color or contrast, may be used to optically distinguish objects on the surface 99 of melt 39 from melt 39 itself. Floating solid polysilicon 37 has a higher intensity than the melt 39 and, thus, is seen as a step change at the solid-melt interface.

As part of the detection step 117, processor 71 performs, for example, connectivity analysis to group the detected edges in the image as a function of their locations in the image (i.e., their coordinates). In this manner, vision system 69 (or computer 63) defines one or more objects in the image. Each defined object includes one or more pixels and is representative of a portion of solid silicon that is visible on melt surface 99. As an example, the defined object or objects may be described by a bounding box (i.e., the smallest rectangle that would enclose an irregular-shaped object) and its coordinates in the image. In the alternative, the defined objects may be described by conventional blob analysis, by examining the shape of the object (e.g., the ratio of the object's major and minor axes) or by examining the area of the object itself.

At step 119, the image processor 71 of vision system 67 determines parameters of crystal growing apparatus 23 based on the defined objects. For example, such parameters include melt completion, seed-melt contact, loss of zero dislocation growth, the presence of crystallized melt 39, such as ice 111, the presence of attached portion is of polysilicon 37, such as hanger 101, and the presence of quartz in melt 39. At step 121, image processor 71 reports the determined parameters to PLC 73. In one embodiment, system 21 includes one PLC 73 for each crystal growing apparatus 23.

Image processor 71 also calculates other parameters of the growth process based on the defined objects at step 123. For example, image processor 71 determines some or all of the following parameters: the size of unmelted polysilicon charge 37, the dip temperature of melt 39, the diameter of crystal 41, the diameter of crucible 27, the size of the detected ice 111, the distance from ice 111 to crystal 41, the size of the detected hanger 101, the distance of hanger 101 to the center of crucible 27 and the size of the detected quartz. At step 121, image processor 71 also reports these parameters to PLC 73. Control unit 55 then executes programs at step 125 in response to the determined parameters for controlling crystal growing apparatus 23.

Figure 6:
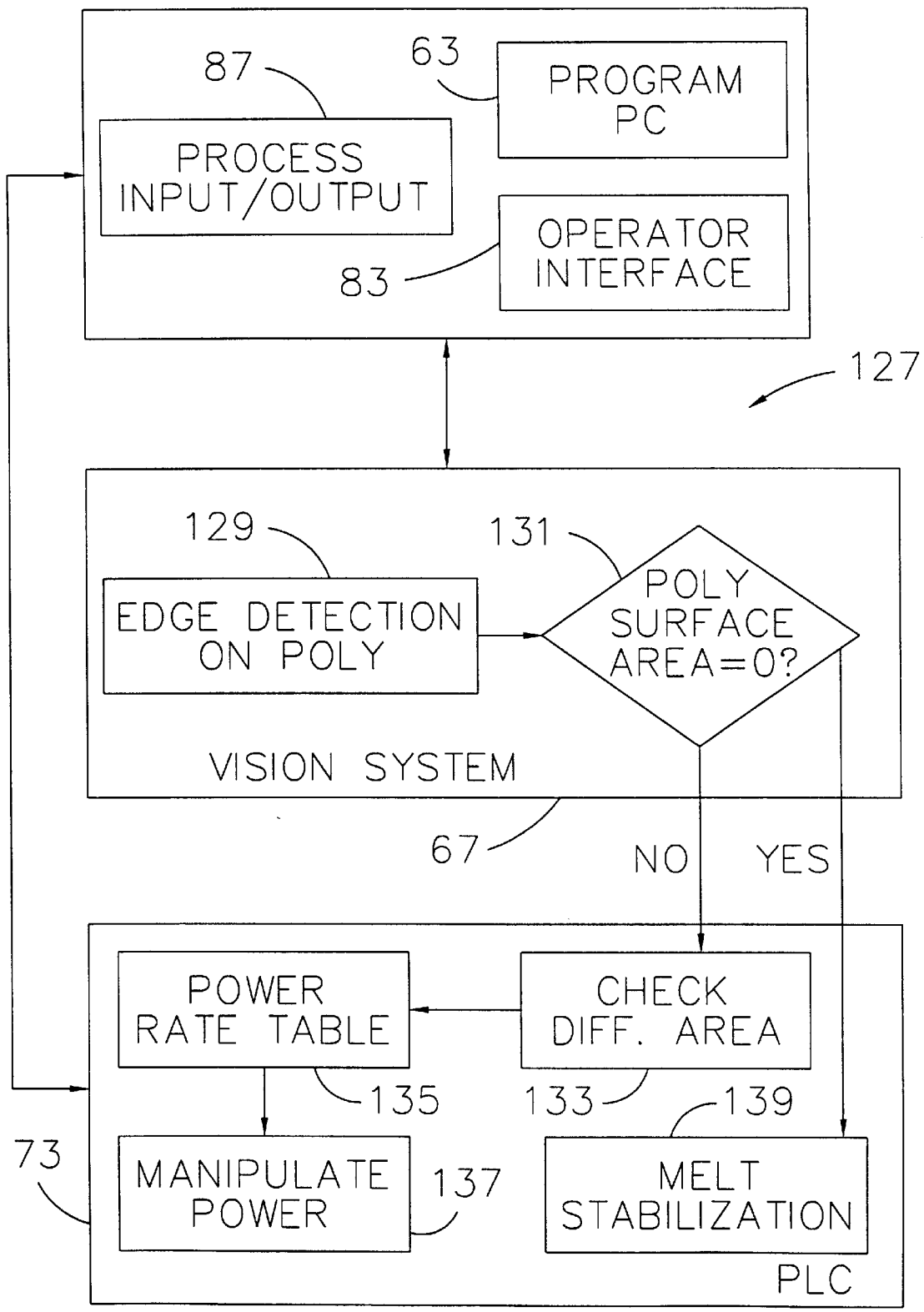

FIG. 6 illustrates the operation of system 21 according to one preferred embodiment in the form of a flow diagram 127. In addition, FIG. 6 illustrates various components of control unit 55 for executing the steps of flow diagram 127.

In operation, system 21 provides an indication of when polysilicon charge 37 is completely melted before control unit 55 initiates the seed dip phase of the growth process. In contrast, existing control systems must rely on an operator determining melt-down or an assumption that the melt-down is complete after a predetermined heating interval. By examining the images showing floating polysilicon 37 on surface 99, vision system 67 is able to compute the surface area per image. This may be accomplished by edge detection and measuring the diameter of crucible 27 for translating pixels to surface area. The difference in the size of the remaining charge 37 is then used to provide the rate of melting which can then be used by control unit 55 to adjust the power of heater 31 in order to achieve a desirable melting rate. This provides closed loop temperature control of the melt-down versus the open loop power control used in present automation systems.

Further, the rate of melting of polysilicon 37 provides an indication of the seeding (i.e., dip) temperature. The effect of crucible rotation is considered because melting typically occurs at a much slower rotation rate than dipping. For example, crucible 27 rotates at approximately 1–2 rpm during meltdown and rotates at approximately 10–15 rpm at dip. Therefore, the power supplied to heater 31 by power supply 29 should be changed as a function of the rotation rate.

Referring now to the embodiment of FIG. 6, the entire melt-down phase typically lasts about three to four hours. After an initial heating period of approximately 2 hours, for example, vision system 67 begins inspection of the interior of crucible 27. In a preferred embodiment, camera 57 images the central region of melt surface 99 to monitor the melt-down phase. When instructed by PLC 73 to start inspection, the frame buffer 69 of vision system 67 acquires images of the interior of crucible 27 at regular intervals (e.g., every one second). At step 129, image processor 71 processes the images to detect the presence of unmelted polysilicon 37 floating on the surface 99 of melt 39. In this instance, the pixels corresponding to the edges of the unmelted polysilicon 37 have significantly higher gray levels, or pixel values, than the surrounding melt 39. In other words, melt 39 appears darker than the edges of solid polysilicon 37. By detecting the edges of the floating polysilicon 37, vision system 67 is able to obtain an approximate measurement of the surface area (i.e., size) of the floating silicon 37 at step 131. For example, vision system 67 determines a parameter indicating the size of floating polysilicon 37 from 1 mm$^2$ to 150 mm$^2$.

For example, a frame or bounding box placed around floating polysilicon 37 on the image defines the size of solid unmelted polysilicon 37. The frame reduces in size to zero as polysilicon 37 melts. Control unit 55 uses this measurement to obtain an automated indication of melt completion. In this regard, melt completion refers to the time when the last piece of solid polysilicon 37 is no longer detectable on the surface 99 of melt 39 (i.e., polysilicon charge 37 is completely molten). Essentially, the melt completion parameter is a digital indication of yes or no.

In particular, image processor 71 executes an inspection algorithm at step 131 to form a difference image by first subtracting successive frames over a subwindow, or region of interest, covering the central region of melt 39. In this manner, vision system 67 discounts any constant features in the images (e.g., splashes of silicon that have solidified on the viewport window). At the same time, image processor 71 preserves sensitivity to any luminance changes in the field of view. The changes revealed by the subtraction routine indicate changes in the shape, position, or angle of solid polysilicon 37 floating on melt 39, changes in the reflectance of melt surface 99 resulting from surface waves or changes in the local melt temperature due to turbulence in melt 39. Preferably, the contrast and size thresholds are set high enough to reject changes caused by surface waves and local variations in melt temperature but not so high as to miss small islands of solid polysilicon 37. By applying a blob analysis, for example, to the difference image, vision system 67 detects high intensity subregions resulting from a change in successive images. If a subregion exceeding a fixed intensity and size threshold is found, then vision system 67 reports the presence of solid polysilicon 37 in the field of view and also reports a time-averaged subregion size.

If vision system 67 determines at step 131 that the surface area is not yet zero, operation proceeds to step 133. At step 133, PLC 73 performs a routine for determining the rate of change of polysilicon charge 37. The rate of change in the size of the solid polysilicon 37 is indicative of the rate at which polysilicon 37 is melting and, thus, related to the melt temperature. In a preferred embodiment, image processor 71 reports the rate to PLC 73 every second, for example. Control unit 55 uses this measurement to manipulate the power in order to control the temperature in crucible 27 and, thus, control the melting of polysilicon 37. In response to the melting rate determined at step 133, PLC 73 determines an appropriate power level for heater 31 at step 135 and then causes heater power supply 29 to be adjusted accordingly at step 137.

In contrast, after the surface area becomes zero at step 131, vision system 67 increments a counter that keeps track of the number of successive frames since solid polysilicon 37 was last detected. This counter is reset to zero whenever solid polysilicon 37 is detected. If several successive acquired images (e.g., 30 images at one per second) pass without detecting any solid polysilicon 37, then image processor 71 reports melt completion to PLC 73 and proceeds to the next phase of melt stabilization at step 139 prior to dipping seed crystal 43.

In a manner similar to the detection of floating polysilicon 37 on melt surface 99, it is contemplated that vision system 67 may also be used to observe small quartz pieces that become attached to polysilicon 37 near the end of the melt-down phase. Often, such quartz pieces (usually as a group) continue to float even after polysilicon charge 37 is molten. The quartz pieces are characterized by relatively high gray levels, relatively small sizes (i.e., less than the last visible polysilicon piece 37) and rapid movement. In this instance, the quartz pieces are distinguishable from polysilicon 37 based on a step change in gray level. Again, it is desired to be able to distinguish a floating piece of quartz from solid polysilicon 37 and report on its size. According to the invention, vision system 67 performs continuous tracking of melt surface 99 and reports the presence of detectable quartz pieces. It is further contemplated that the quartz parameter provides an indication of the size of the quartz from 1 $mm^2$ to 150 $mm^2$, for example, in addition to indicating whether or not quartz is present in melt 39.

According to a preferred embodiment of the invention, vision system 67 begins monitoring melt level 53 once the initial melt-down stage is complete. For purposes of this application, melt level 53 is defined as the distance from the top of heater 31 to the surface 99 of melt 39 and may be determined as a function of the coordinates of a center point C. Preferably, image processor 71 determines the center point C which is indicative of melt level 53. In this embodiment, the difference between the y coordinate of center point C and a reference value is used to determine melt level 53. Alternatively, commercially available optical methods (e.g., a light beam/detector apparatus mounted on the cover plate of chamber 25) may be used to determine melt level 53. The determination of melt level 53 may be used to reduce variability of, for example, diameter measurements by the calculation of a correction factor and by reducing melt level 53 variation through lift control of crucible 27. In one embodiment of the invention, the melt level parameter is representative of melt levels ranging from ±75 mm.

Preferably, system 21 employs a multiple camera arrangement wherein wide field camera 57 images the melt-crucible interface and narrow field camera 57 images the melt-crystal interface. At periodic intervals, these interfaces (i.e., meniscus 109 and meniscus 59, respectively) are separately detected and an ellipse, for example, is fit to each. The width and center point of each ellipse may then be used in a formula that derives the physical melt level 53 relative to a fixed z-axis origin. The formula also makes use of the known camera angle, the focal length of the lens, the sample rate of the sensor, and the distance to the common rotation axis 47 of crucible 27 and crystal 41. In the growth process, melt level 53 relative to the crucible wall goes down as the melt is depleted by the growing crystal. The crucible is raised, however, to maintain melt level 53 at substantially the same vertical position.

Commonly assigned application Ser. No. 08/459,765, filed Jun. 2, 1995, and commonly assigned application Ser. No. 08/620,137, filed Mar. 21, 1996, the entire disclosures of which are incorporated herein by reference, describe a preferred method and system, respectively, for accurately and reliably measuring crystal diameter as well as melt level. In addition to crystal diameter measurements, crucible diameter measurements are useful in calculating melt level 53, especially prior to pulling crystal 41. Further, accurate measurement of this parameter reduces the error due to dimensional variations from crucible to crucible and due to thermal expansion during each run. Accordingly, vision system 67 detects and processes the melt-crucible meniscus 109 similar to the melt-crystal meniscus 59 to obtain an online diameter measurement of crucible 27.

As described above, one embodiment of the present invention includes temperature sensor 61 for providing information regarding the temperature of melt 39. The melt temperature is typically measured by direct or indirect secondary sensors, such as temperature sensor 61, situated at a fixed position relative to melt 39. In general, such sensors require manual calibration and are not capable of scanning and mapping the melt surface temperature. In an alternative embodiment, vision system 67 provides melt temperature information instead of or in addition to temperature sensor 61 to overcome these deficiencies associated with conventional temperature sensors.

According to the invention, the captured images showing the remaining unmelted portions of polysilicon charge 37 also provide information regarding the temperature of melt 39. When melting a very small piece of crystalline solid in its melt, the solid-melt interface is approximately at the solid's melting point temperature. The regions in the solid away from interface tend to have a temperature lower than the melting point. Conversely, the regions in the melt away from interface tend to have a temperature higher than the melting point.

In the present invention, it is assumed that the interface of a very small sample of solid polysilicon 37 has a temperature close to the melting point of silicon (i.e., 1414° C.; 1687° K.) just prior to becoming molten. Accordingly, a preferred embodiment of the invention sets the gray level of the solid-melt interface equal to the silicon melting point. The blackbody radiation equation may then be used to obtain a ratio between the melt temperature for two pixels based on the ratio of their intensities. Using this method, the temperature of melt 39 for each of the pixels can be obtained. Preferably, image processor 71 reports the melt temperature parameter to PLC 73 every one second, for example. Control circuit 55 uses this measurement to manipulate the power in order to control the temperature in crucible 27 and, thus, control the melting of polysilicon 37. This invention provides closed loop control of the temperature of melt surface 99 to obtain a desired dip temperature.

As an example, vision system 67 processes a number of images of melt surface 99 captured during meltdown prior to the dip phase. A median filtering technique, for example, reduces the fluctuation in intensity from pixel to pixel within a certain range. In one embodiment, vision system 67 disregards the pixels at the solid-melt interface to further distinguish between the pixels of melt surface 99 and the pixels of solid polysilicon 37.

In general, the gray level at the interface between melt 39 and the last piece of polysilicon 37 observed floating on melt surface 99 is substantially constant and defined as corresponding to the melting point temperature of silicon. The regions surrounding the last piece of polysilicon 37 are darker (i.e., they have a lower gray level) than the rest of melt surface 99. Thus, the temperature of melt 39 corresponding to the other pixels in a captured image may be determined according to the following equation:

$$(T/1687° K.) = (GL/GLI)^{1/4}$$

where GLI is the pixel value, or gray level, at the melt-solid interface for unmelted polysilicon 37 and GL is the pixel value, or gray level, at another position in the image.

Further to the example, the melt temperature parameter ranges from 1000° C. to 1600° C. If GLI is 79 (corresponding to a temperature of 1414° C.) and GL is 73 at the center of melt surface 99, then the temperature at the melt center is approximately 1381° C. Preferably, control unit 55 increases the power provided to heater 31 by heater power supply 29 to increase the temperature of melt 39 since the dip temperature is desired to be approximately the melting temperature of silicon.

It is to be understood that the crucible rotation rate at the end of melt-down typically differs from the crucible rotation rate at the beginning of the dip phase. This difference may account for variations in intensity due to reflections from melt surface 99 which may result in temperature errors. Further, an IR sensitive camera may provide improved results.

Figure 7:
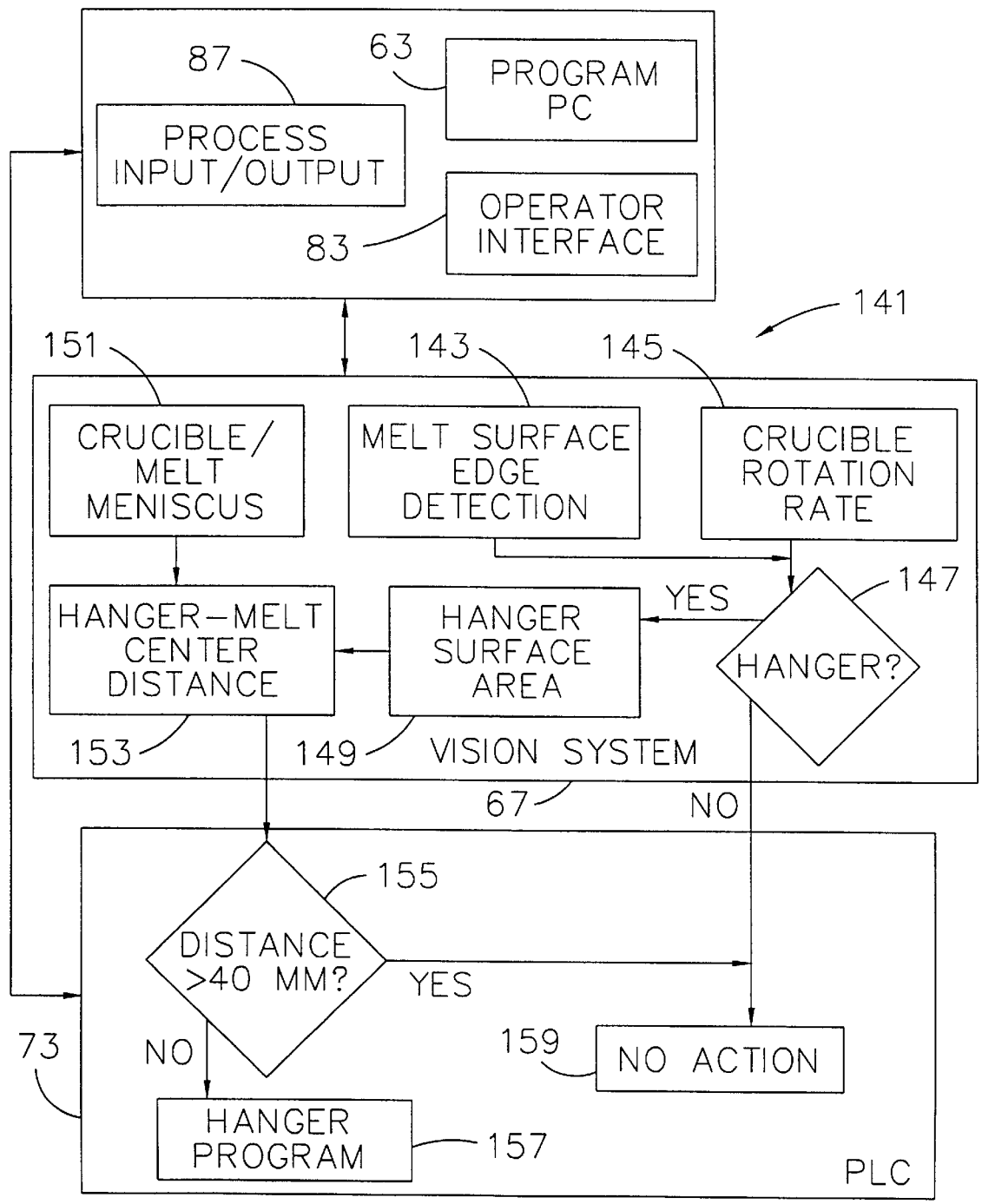

FIG. 7 illustrates the operation of system 21 according to one preferred embodiment in the form of a flow diagram 141. In addition, FIG. 7 illustrates various components of control unit 55 for executing the steps of flow diagram 141.

In operation, system 21 provides an indication of when a portion of polysilicon 37, such as the hanger 101 shown in FIG. 3, becomes attached to crucible wall 97. Advantageously, system 21 provides not only a yes/no parameter indicating whether or not hanger 101 is present but also provides a hanger size parameter from 1 mm² to 150 mm², for example, by detecting its reflection on melt surface 99. This enables control unit 55 to measure the distance from hanger 101 to the center of melt 39 so that it can determine whether the presence of hanger 101 is likely to interfere with diameter tracking by camera 57 during the run. As before, detection is based on the sharp changes in gray level. In this instance, however, vision system 67 is able to distinguish a reflection from hanger 101 from other reflections due to its fixed position on melt surface 99 (i.e., attached to the wall 97 of crucible 27).

As shown in FIG. 7, vision system 67 begins at step 143 by processing the acquired images as a function of the pixel values to detect edges in the image. The image processor 71 of vision system 67 also examines the rotation rate of crucible 27 at step 145. Preferably, camera 57 has a wide field of view which allows vision system 67 to acquire images of the entire width of melt 39 up to where it meets the wall 97 of crucible 27. With the aid of the crucible rotation signal, vision system 67 is able to acquire images at several known crucible rotation angles. This provides a digital input pulse to image processor 71 once each rotation of crucible 27. By obtaining images at known angles, high contrast reflections from melt surface 99 and the like may be discounted and reflections from hangers, such as hanger 101, may be identified.

At step 147, image processor 71 determines whether the detected edges are attributable to a hanging piece of polysilicon 37, such as hanger 101. For example, if the detected edges are grouped to define an object of a certain size and location (i.e., at or above the crucible-melt interface) and the object repeats itself periodically as a function of the crucible rotation rate, then vision system 67 identifies the object as a hanger and proceeds to step 149. At step 149, image processor 71 calculates the approximate surface area of hanger 101.

In addition, vision system 67 detects edges in the images at step 151 for identifying the meniscus 109 visible at the crucible-melt interface. By detecting meniscus 109, image processor 71 determines the width of crucible 27 and, thus, determines its center. At step 153, image processor 71 provides a measure of the distance from the center of melt 39 to hanger 101 based on its surface area. Proceeding to step 155, PLC 73 then executes a hanger program at step 157 if the distance from hanger 101 to the center of melt 39 is less than a predetermined distance (e.g., 40 mm). Advantageously, the hanger program instructs control unit 55 on how to control crystal growing apparatus 23 is such a way as to cause hanger 101 to melt. On the other hand, PLC 73 takes no action, shown at step 159, if no hanger is detected at step 147 or if the hanger is not likely to interfere (i.e., it is more than 40 mm from the melt center).

With respect to the dip phase of the crystal growth process, vision system 67 also detects when seed crystal 43 contacts the upper surface 99 of melt 39. In general, crystal drive unit 51 causes seed crystal 43 to travel downward until it touches melt surface 99. Advantageously, the image processing tools of vision system 67 detect the reflection of seed crystal 43 on melt surface 99 and measure the distance between the two. As seed crystal 43 nears melt 39, the reflection will gradually become obscured from view by seed crystal 43 itself. When the reflection appears to have completely disappeared, seed-melt contact has occurred. Meniscus 59, which forms on melt 39 at the seed-melt interface, provides a secondary indication of contact.

Figure 8:
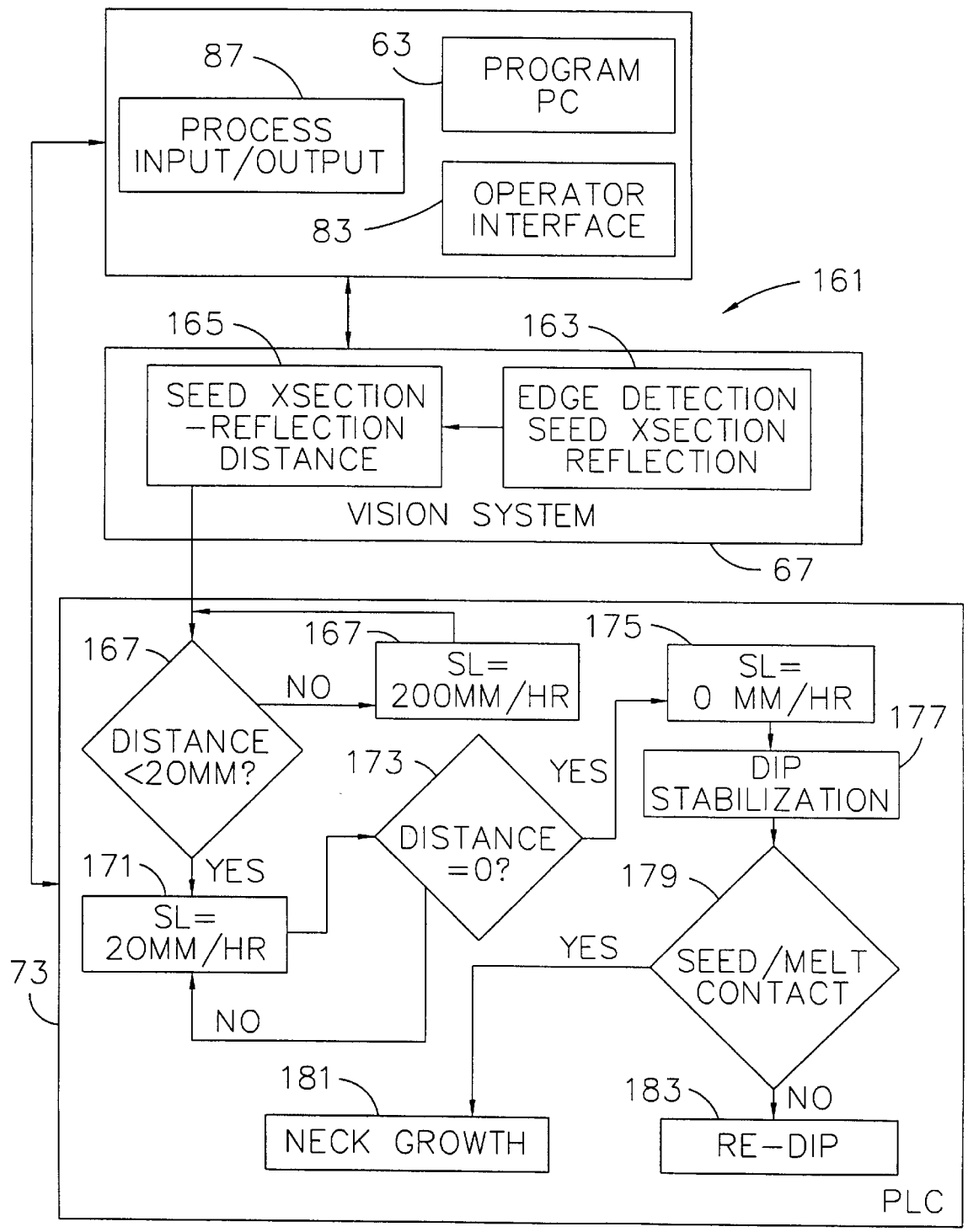

FIG. 8 illustrates the operation of system 21 according to one preferred embodiment in the form of a flow diagram 161. In addition, FIG. 8 illustrates various components of control unit 55 for executing the steps of flow diagram 161.

In operation, system 21 provides an indication of when seed crystal 43 contacts melt 39. As shown in FIG. 8, vision system 67 begins at step 163 by processing the acquired images as a function of the pixel values to detect edges in the image. In particular, the image processor 71 of vision system 67 detects edges associated with seed crystal 43 and the reflection of its cross section on melt surface 99. At step 165, image processor 71 provides a measure of the distance from seed crystal 43 to melt 39 based on the detected edges in the acquired images. For example, the seed-melt distance parameter ranges from 0–500 mm. According to the invention, vision system 67 reports the seed-melt distance to PLC 73 every second, for example.

Proceeding to step 167, PLC 73 determines when seed crystal 43 reaches a predetermined distance (e.g., 20 mm) from melt surface 99. If seed crystal 43 is at least 20 mm from surface 99, then operation proceeds to step 169. At step 169, PLC 73 causes crystal drive unit 51 to continue lowering seed crystal 43 at a relatively high speed (e.g., 200 mm/hour). On the other hand, PLC 73 causes crystal drive unit 51 to reduce the speed of seed crystal 43 to a much lower speed (e.g., 20 mm/hour) at step 171 when seed crystal 43 is less than 20 mm from surface 99.

Following step 171, PLC 73 proceeds to step 173 for determining if the distance between seed crystal 43 and melt 39 is zero. If not, crystal drive unit 51 continues lowering seed crystal 43 at the same speed. Once the distance becomes zero, however, PLC 73 causes crystal drive unit 51 to stop at step 175. After performing a dip stabilization routine at step 177, PLC 73 determines at step 179 whether seed crystal 43 and melt 39 are in contact. Essentially, the seed-melt contact parameter is a digital indication of yes or no. As an example, seed-melt contact may be indicated by the presence of meniscus 59 on surface 99 at the seed-melt interface. If so, PLC 73 continues operation by initiating neck growth at step 181. On the other hand, if seed-melt contact has not been made, PLC 73 instructs re-dipping seed crystal 43 at step 183.

As an example of the operation of vision system 67 according to the diagram of FIG. 8, image processor 71 utilizes a horizontal search caliper to detect when the shaft of seed crystal 43 enters the field of view from above and records this event. Next, image processor 71 utilizes a vertical search caliper positioned at the horizontal location of the detected seed crystal 43. Preferably, image processor 71 applies this vertical caliper to the image for finding the bottom edge of seed crystal 43. Thereafter, image processor 71 uses the shaft and tip calipers to monitor the descent of seed crystal 43 toward melt 39. Based on the tip location in each successive acquired frame, image processor 71 subtracts the current estimate of the melt surface height from the seed crystal height to obtain a current seed-melt distance.

Further to the example, image processor 71 uses a new vertical search caliper to detect and track the reflection of seed crystal 43 on melt surface 99 when the estimated seed-melt distance falls below a threshold. By monitoring the vertical location of the reflection as well as the tip location, image processor 71 is able to obtain a more accurate estimate of the distance of seed crystal 43 above melt surface 99. Further, tracking the reflection also provides edge contrast threshold data for use in detecting when seed crystal 43 makes contact with melt 39.

Finally, when seed crystal 43 begins to obscure its own reflection from view, image processor 71 applies a pair of calipers with search directions of 45° and −45° just above the tip of seed crystal 43. These calipers detect the first appearance of meniscus 59 as seed crystal 43 just touches the surface 99 of melt 39. In particular, image processor 71 monitors the contrast of edges detected by these calipers until both calipers simultaneously observe edge contrasts that exceed the largest contrast previously produced by the seed reflection. When this happens, image processor 71 reports seed-melt contact to PLC 73. Thereafter, image processor 71 proceeds to use the newly formed meniscus 59 to track the crystal diameter and to estimate melt level 53.

During the pulling phases of crystal growth, image processor 71 preferably performs digital edge detection to locate the coordinates of at least three points around the inside or outside of the bright ring of meniscus 59. Since the cross section of crystal 41 and meniscus 59 is known to be generally circular, the bright ring edge coordinates detected by image processor 71 are assumed to be elliptical, transformed and mapped into a circular shape. In the alternative, the edge coordinates can be mapped into a circular shape by compensating for the distortion caused by the angle at which camera 57 is mounted. Gonzalez and Wintz, *Digital Image Processing*, 1987, pages 36–52, incorporated herein by reference, disclose mathematical transformations for compensating for perspective distortion caused by the position of a camera with respect to a three-dimensional object. Such transformations may be used to extract a circular shape from a distorted elliptical shape. Further, commonly assigned application Ser. No. 08/558,609, filed Nov. 14, 1995, the entire disclosure of which is incorporated herein by reference, describes a non-distorting camera for use in imaging meniscus 59 without the need for complicated mathematical transformations.

As described above, commonly assigned application Ser. Nos. 08/459,765 and 08/620,137 disclose a preferred method and system, respectively, for accurately and reliably measuring crystal diameter. With respect to the diameter measurements, image processor 71 determines edge coordinates along the outside of the bright ring of meniscus 59 based on the detected optical characteristic of the image. Image processor 71 then determines the diameter of crystal 41 based on the detected edges. In one embodiment, the diameter parameter ranges from 0–320 mm, for example.

In a preferred embodiment, PLC 73 of control unit 55 is responsive to the determined diameter D of silicon crystal 41 for controlling the rates at which crucible 27 and crystal 41 are rotated and/or the rate at which crystal 41 is pulled from melt 39 and/or the temperature of melt 39 and is responsive to the determination of melt level 53 for controlling the level of crucible 27 thereby to control crystal growth apparatus 23. As such, closed loop control is performed in maintaining the neck diameter.

A source of variability in the diameter measurements is that the width of the bright ring changes depending on the height of the hot wall of crucible 27 which is exposed and reflected by liquid meniscus 59. As melt 39 is depleted, the width of the bright ring increases which causes crystal 41 to appear larger and may result in the actual crystal 41 being grown undersized. Thus, as an example, detecting the edge between crystal 41 and the bright ring in addition to detecting the edge between melt 39 and the bright ring may be used to provide a measure of bright ring width. Further, mathematical modeling of liquid meniscus 59 taking into account its reflective characteristics with respect to crucible wall height, provides a measure of bright ring width.

In addition to monitoring the diameter of growing crystal 41, system 21 advantageously provides uniform crystal properties by maintaining the growth rate substantially constant. One contemplated method for achieving this is to resolve the height and/or angle of meniscus 59 relative to a plane defined by top melt surface 99. In response to changes in one or both of these parameters, control unit 55 may then adjust the crystal growth process to maintain them relatively constant.

Further, the edge coordinates of meniscus 59 may be used to detect periodic deviations in crystal diameter with respect to the rate at which crystal drive unit 51 rotates crystal 41 as described in commonly assigned application Ser. Nos. 08/459,765 and 08/620,137. As is known in the art, facets, or habit lines, generally parallel to vertical axis 47 and spaced apart along the body of crystal 41 indicate zero dislocation growth. The habit lines, also referred to as growth lines, appear as dimple-like features on the perimeter of a cross section of crystal 41. For this reason, as crystal 41 rotates at a known rate, habit lines are expected within a particular region of interest on the image at a rate of, for example, four times the rate of rotation for a <100> orientation and twice the rate of rotation for a <001> orientation. As such, image processor 71 is able to confirm zero dislocation growth of crystal 41. In response to vision system 67 detecting a loss of zero dislocation growth, control unit 55 initiates a re-melt.

The facets usually become highly visible at the start of the crystal's crown and zero dislocation inspection is not required for the first approximately one inch (2.54 cm) of the body growth. In a preferred embodiment, vision system 67 detects zero dislocation growth based on the symmetry of habit lines and periodic deviations in diameter at expected angular positions for a given crystal rotation rate. If a loss of zero dislocation occurs, the first visible sign is a loss of the symmetry of the facets which will eventually disappear altogether and the body will become a round facetless cylinder. Vision system 67 periodically estimates the two-dimensional cross section of crystal 41 in the plane defined by melt surface 99 and then analyzes this cross section for a loss of symmetry and/or a loss of facet definition. Each estimated cross section includes an estimate of the mean diameter of crystal 41 as well as the deviation of the cross section from this mean value as a function of cylindrical angle about the central axis 47 of crystal 41.

According to a preferred embodiment, system 21 also provides detection and control of the formation of ice 111 (i.e., the crystallization, or freezing, of molten polysilicon 37 on melt surface 99, usually next to crucible wall 97 and near the end of body growth or during bottom growth). As before, detection is based on the sharp changes in gray level. In this instance, however, vision system 67 is able to distinguish the presence of ice 111 from other objects or reflections due to its fixed position on melt surface 99 (i.e., typically adjacent the wall 97 of crucible 27).

Figure 9:
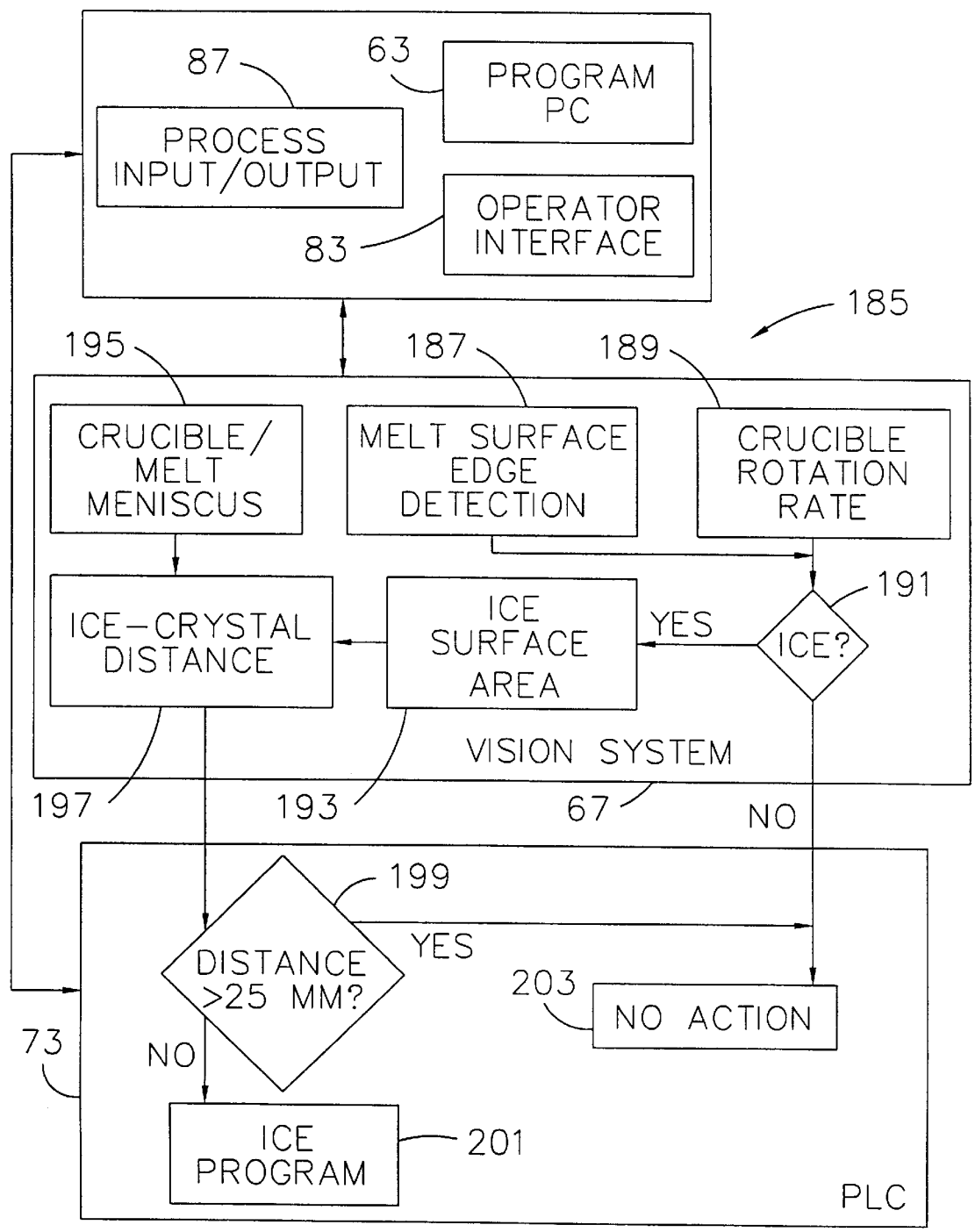

FIG. 9 illustrates the operation of system 21 according to one preferred embodiment in the form of a flow diagram 185. In addition, FIG. 9 illustrates various components of control unit 55 for executing the steps of flow diagram 185.

In operation, system 21 provides an indication of when a portion of polysilicon 37, such as crystallized polysilicon, namely, ice 111 shown in FIG. 4, becomes attached to crucible wall 97 during the pulling phase of the crystal growth process. Advantageously, system 21 provides not only a yes/no parameter indicating whether or not ice 111 is present but also provides an ice size parameter from 1 mm$^2$ to 150 mm$^2$, for example, by detecting its presence on melt surface 99. This enables control unit 55 to measure the distance from ice 111 to crystal 41 so that it can determine whether the presence of ice 111 is likely to interfere with crystal growth during the run. As before, detection is based on the sharp changes in gray level. In this instance, however, vision system 67 is able to distinguish ice 111 from other objects or reflections due to its fixed position on melt surface 99 (i.e., attached to the wall 97 of crucible 27).

As shown in FIG. 9, vision system 67 begins at step 187 by processing the acquired images as a function of the pixel values to detect edges in the image. The image processor 71 of vision system 67 also examines the rotation rate of crucible 27 at step 189. As before, camera 57 preferably has a wide field of view which allows vision system 67 to acquire images of the entire width of melt 39 up to where it meets the wall 97 of crucible 27. Thus, with the aid of the crucible rotation signal, vision system 67 is able to acquire images at several known crucible rotation angles. This provides a digital input pulse to image processor 71 once each rotation of crucible 27. By obtaining images at known angles, high contrast reflections from melt surface 99 and the like may be discounted and the presence of ice 111 may be identified.

At step 191, image processor 71 determines whether the detected edges are attributable to a crystallized piece of polysilicon 37, such as ice 111. For example, if the detected edges are grouped to define an object of a certain size and location (i.e., at the crucible-melt interface) and the object repeats itself periodically as a function of the crucible rotation rate, then vision system 67 identifies the object as ice and proceeds to step 193. At step 193, image processor 71 calculates the approximate surface area of ice 111.

In addition, vision system 67 detects edges in the images at step 195 for identifying the meniscus 59 visible at the crystal-melt interface. By detecting meniscus 59, image processor 71 determines the width of crystal 41. At step 197, image processor 71 provides a measure of the distance from the edge of crystal 41 to ice 111 based on its surface area. Proceeding to step 199, PLC 73 then executes an ice program at step 201 if the distance from ice 111 to crystal 41 is less than a predetermined distance (e.g., 25 mm). Advantageously, the ice program instructs control unit 55 to halt or terminate operation if ice 111 is too close to crystal 41. It is also contemplated that the ice program instructs control unit 55 to take remedial measures in certain situations. For example, if ice 111 is detected relatively early in the run, the ice program causes heater power supply 29 to increase the heat provided to crucible 27 to melt the crystallized silicon and causes crystal drive unit 51 to decrease the pull rate to compensate for the smaller crystal diameter resulting from the increased heat. On the other hand, PLC 73 takes no action, shown at step 203, if no ice is detected at step 191 or if ice 111 is not likely to interfere (i.e., it is more than 25 mm from crystal 41).

Further, it is to be understood that vision system 67 of the present invention may be used to determine other crystal growth parameters, such as purge tube gap or melt gap and convection currents, in addition to complete melt-down, melting rate, temperature, ice or hanger distance, crystal diameter, melt level and loss of zero dislocation growth.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A closed loop control method for use in combination with an apparatus for growing a silicon single crystal, said crystal growing apparatus having a heated crucible for melting solid silicon to form a melt from which the single crystal is pulled, said melt having an upper surface above which unmelted silicon is exposed until melted, said method comprising the steps of:

generating images of a portion of the interior of the crucible with a camera, said images each including a plurality of pixels, said pixels each having a value representative of an optical characteristic of the image;

processing the images as a function of the pixel values to detect edges in the images;

grouping the detected edges as a function of their locations in the images to define objects in the images, said defined objects each including one or more pixels and at least one of said defined objects being representative of a portion of solid silicon which is visible on the melt surface;

determining at least one parameter representative of a condition of the crystal growing apparatus based on the defined objects; and controlling the crystal growing apparatus in response to the determined parameter.

2. The method of claim 1 wherein the processing step comprises subtracting successive images from each other to generate difference images that identify changes from one image to the next and wherein the edges detected in the difference images are grouped to define the defined object representing the portion of solid silicon visible on the melt surface.

3. The method of claim 2 further comprising the step of determining an approximate size of the portion of solid silicon visible on the melt surface as a function of the number of pixels in the defined object in the difference images.

4. The method of claim 3 wherein the parameter determining step comprises determining a melt completion parameter representative of the silicon in the crucible being substantially molten, said melt completion parameter being a function of the size of the portion of solid silicon visible on the melt surface reaching approximately zero.

5. The method of claim 4 wherein the controlling step comprises initiating the pulling of the single crystal from the melt in response to the melt completion parameter indicating that the silicon in the crucible is substantially molten.

6. The method of claim 3 wherein the parameter determining step comprises determining a melting rate parameter representative of a rate at which the silicon in the crucible is melting, said melting rate parameter being a function of changes in the size of the defined object representing the portion of solid silicon visible on the melt surface relative to time.

7. The method of claim 6 wherein the controlling step comprises adjusting the heat provided to the crucible in response to the melting rate parameter so that the silicon in the crucible melts at a desired rate.

8. The method of claim 1 wherein the processing step comprises detecting an interface between the melt and the portion of solid silicon on the melt surface based on the edges detected in the images and wherein the parameter determining step comprises determining a melt temperature parameter representative of a temperature of the melt at different locations on the melt surface, said melt temperature parameter being a function of the pixel value of at least one of the pixels in the image adjacent the interface between the melt and the portion of solid silicon.

9. The method of claim 8 wherein the step of determining the melt temperature parameter comprises identifying the at least one pixel in the image adjacent the interface between the melt and the portion of solid silicon and defining its pixel value to correspond approximately to the melting point temperature of the silicon so that the melt temperature parameter is a function of the ratio of the pixel value of the identified pixel to the pixel value of another pixel in the image.

10. The method of claim 8 wherein the controlling step comprises adjusting the heat provided to the crucible in response to the melt temperature parameter so that the melt is at a desired temperature.

11. The method of claim 1 wherein the processing step comprises detecting an interface between the melt and an inner wall of the crucible based on the edges detected in the images and further comprising the step of detecting when the portion of solid silicon is adjacent the inner wall of the crucible.

12. The method of claim 11 further comprising the step of defining a pixel location corresponding to the approximate center of the crucible and wherein the parameter determining step comprises determining a hanger distance parameter representative of a distance from the center of the crucible to the portion of solid silicon detected adjacent the inner wall of the crucible, said hanger distance parameter being a function of the location of at least one of the pixels in the defined object representative of the portion of solid silicon detected adjacent the inner wall of the crucible relative to the pixel location corresponding to the approximate center of the crucible.

13. The method of claim 12 wherein the controlling step comprises adjusting the heat provided to the crucible in response to the hanger distance parameter so that the portion of solid silicon detected adjacent the inner wall of the crucible melts.

14. The method of claim 11 wherein the processing step comprises detecting a crystal meniscus on the melt surface based on the edges detected in the images, said crystal meniscus being visible adjacent the single crystal as it is pulled from the melt, and wherein the parameter determining step comprises determining an ice distance parameter representative of a distance from the portion of solid silicon detected adjacent the inner wall of the crucible to the crystal meniscus, said ice distance parameter being a function of the location of at least one of the pixels in the defined object representative of the portion of solid silicon detected adjacent the inner wall of the crucible relative to the location of at least one of the pixels at an edge of the crystal meniscus.

15. The method of claim 14 wherein the controlling step comprises terminating the pulling of the single crystal from the melt if the distance from the portion of solid silicon detected adjacent the inner wall of the crucible to the crystal meniscus as represented by the ice distance parameter is less than a predetermined distance.

16. The method of claim 1 wherein the single crystal is grown from a seed crystal dipped into and then pulled from the melt, at least one of said defined objects being representative of a reflection of the seed crystal visible on the melt surface before the seed crystal contacts the melt, and further comprising the step of determining an approximate size of the reflection of the seed crystal as a function of the number of pixels in the defined object.

17. The method of claim 16 wherein the parameter determining step comprises determining a seed-to-melt contact parameter representative of the seed crystal contacting the melt surface, said seed-to-melt contact parameter being a function of the size of the reflection of the seed crystal on the melt surface reaching approximately zero.

18. The method of claim 17 wherein the controlling step comprises initiating the pulling of the seed crystal from the melt in response to the seed-to-melt contact parameter.

19. The method of claim 1 wherein the processing step comprises detecting a crucible meniscus on the melt surface based on the edges detected in the images, said crucible meniscus being visible adjacent the crucible, and wherein the parameter determining step comprises determining a crucible width parameter representative of a width of the crucible, said crucible width parameter being a function of the number of pixels between opposite edges of the crucible meniscus.

20. The method of claim 1 wherein the crystal growing apparatus provides for rotation of the single crystal at a reference rate and wherein the processing step comprises detecting a facet line on the single crystal based on the edges detected in the images and the parameter determining step comprises determining a zero dislocation parameter representative of zero dislocation growth of the single crystal, said zero dislocation parameter being a function of the facet line being detected in the image at predetermined positions on the single crystal relative to the reference rate of rotation.

21. The method of claim 1 wherein the crystal growing apparatus provides for relative movement between the single crystal and the crucible and wherein the controlling step comprises controlling the relative movement between the single crystal and the crucible and/or controlling the temperature of the melt in response to the determined parameter thereby to control the crystal growing apparatus.

22. A system for use in combination with an apparatus for growing a silicon single crystal, said crystal growing apparatus having a heated crucible for melting solid silicon to form a melt from which the single crystal is pulled, said melt having an upper surface above which unmelted silicon is exposed until melted, said system comprising:

a camera for generating images of a portion of the interior of the crucible, said images each including a plurality of pixels, said pixels each having a value representative of an optical characteristic of the image;

an image processor for processing the images as a function of the pixel values to detect edges in the images, said image processor grouping the detected edges as a function of their locations in the images to define objects in the images, said defined objects each including one or more pixels and at least one of said defined objects being representative of a portion of solid silicon which is visible on the melt surface; and a control circuit for determining at least one parameter representative of a condition of the crystal growing apparatus based on the defined objects and controlling the crystal growing apparatus in response to the determined parameter.

* * * * *